United States Patent
Imenes et al.

(10) Patent No.: US 7,876,164 B2
(45) Date of Patent: Jan. 25, 2011

(54) PHASE LOCKED OSCILLATOR

(75) Inventors: Ben Jarle Imenes, Tonsberg (NO); Stig Rooth, Asker (NO)

(73) Assignee: Norspace AS, Horten (NO)

( * ) Notice: Subject to any disclaimer, the term of this patent is extended or adjusted under 35 U.S.C. 154(b) by 125 days.

(21) Appl. No.: 12/295,021

(22) PCT Filed: Feb. 21, 2007

(86) PCT No.: PCT/NO2007/000066

§ 371 (c)(1),
(2), (4) Date: Sep. 29, 2008

(87) PCT Pub. No.: WO2007/114705

PCT Pub. Date: Oct. 11, 2007

(65) Prior Publication Data

US 2009/0115534 A1 May 7, 2009

(30) Foreign Application Priority Data

Mar. 30, 2006 (NO) .................................. 20061439

(51) Int. Cl.
*H03L 7/06* (2006.01)
*H03L 7/085* (2006.01)
*H03L 7/091* (2006.01)
*H03L 7/099* (2006.01)
(52) U.S. Cl. ..................... 331/25; 331/18; 331/107 A
(58) Field of Classification Search .................. 331/8, 331/16–18, 25, 107 A; 327/156–159; 455/260
See application file for complete search history.

(56) References Cited

U.S. PATENT DOCUMENTS

| 4,720,688 A | | 1/1988 | Hasegawa et al. ............... 331/2 |
| 5,055,800 A | * | 10/1991 | Black et al. .................. 331/1 A |
| 5,345,193 A | * | 9/1994 | Bradley ........................ 331/16 |

(Continued)

FOREIGN PATENT DOCUMENTS

GB 2 044 025 A 10/1980

(Continued)

OTHER PUBLICATIONS

Lefevre P., et al., "A Full GAAS MMIC Phase-Locked Oscillator Using Sampling Phase Detector and a Sampling Frequency Detector," 2000 European Conference on Wireless Technology Conference Proceedings, ECWT 2000, Paris, Oct. 5-6, 2000, European Conference on Wireless Technology, ECWT, London: CMP, GB, Oct. 5, 2000, pp. 17-20, XO001060790.

(Continued)

*Primary Examiner*—David Mis
(74) *Attorney, Agent, or Firm*—Heslin Rothenberg Farley & Mesiti P.C.

(57) ABSTRACT

There is provided an analog phase locked oscillator comprising a sampling phase detector, a loop filter, a voltage controlled oscillator, a frequency multiplier and a feedback loop where the feedback loop connects the output of said oscillator with the input of said phase detector through said frequency multiplier. The sampling phase detector is adapted to perform a discrete phase comparison between a reference frequency and the multiplied feedback signal. The voltage controlled oscillator is adapted to give out a constant frequency at a multiply of the reference frequency divided with the multiplication factor of the multiplier.

7 Claims, 2 Drawing Sheets

U.S. PATENT DOCUMENTS

| | | | | |
|---|---|---|---|---|
| 5,748,144 | A * | 5/1998 | Rodal | 342/357.12 |
| 6,441,692 | B1 | 8/2002 | Nakatani et al. | 331/42 |
| 2002/0145475 | A1 | 10/2002 | Fenton et al. | 331/25 |
| 2007/0104292 | A1 * | 5/2007 | Gregorius | 375/327 |

FOREIGN PATENT DOCUMENTS

WO      WO 00/77936 A1    12/2000

OTHER PUBLICATIONS

Bateman, Andrew fra: "Transmitter & Receiver Architectures," http//www.avren.com/Courses/Tx_Rx_Architectures_plain.htm, Transmitter and Receiver Architectures basic Building blockes.

International Search Report for International Patent Application No. PCT/NO2007/000066, dated May 29, 2007.

Norwegian Search Report for Norwegian Patent Application No. 20061439, dated Sep. 22, 2006.

* cited by examiner

PHASE LOCKED OSCILLATOR

CROSS REFERENCE TO RELATED APPLICATIONS

This application is a national stage filing under section 371 of International Application No. PCT/NO2007/000066, filed on Feb. 21, 2007, and published in English on Oct. 11, 2007 as WO 2007/114705 and claims priority to Norwegian application No. 2006 1439 filed on Mar. 30, 2006, the entire disclosure of these applications being hereby incorporated herein by reference.

TECHNICAL FIELD OF THE INVENTION

The present invention is in general related to oscillator circuits for use as signal sources in communication and radar applications.

More particularly, the present invention is related to a phase locked oscillator intended for, but not restricted to, use in frequency converters devices, such as frequency up-converters or frequency down-converters.

BACKGROUND TO THE INVENTION

Voltage controlled oscillators (VCOs) are phase locked for applications in VHF, UHF and microwave frequency ranges. Typical applications of such phase locked oscillators are abundant in the field of communication systems technology and radar applications as stable, low-phase noise signal sources.

Both digital and analog phase lock techniques are known. Digital phase locking can, for example, be achieved by using a frequency divider to divide a high frequency of a VCO to a lower frequency of a crystal reference. Such a technique is useful at low frequencies down to about 1 MHz, but can also be used at higher frequencies up to and beyond 3 GHz. A limitation of these devices is their phase noise characteristics. An example of a phase locked loop realized in digital form has been described, for example in U.S. Pat. No. 5,061,904 to Mantopoulos et al.

Analog phase locking of oscillators can be achieved using a sampling phase detector (SPD), see for example "*Theory and Application of Sampling Phase Detector, Application Note APN5001*", from Skyworks Solutions, Inc., dated Jul. 21, 2005, where it is described how the SPD can be used for phase locking a dielectric resonator Oscillator (DRO). U.S. Pat. No. 6,753,704 B1 to Desgrez et al. describes an example of an analog sampling phase detector.

Such techniques are generally attractive because of the low phase noise levels that are achievable in such circuits.

A limitation of the SPLO (Sampling Phase Locked Oscillator) solution has been the limitations in frequency selection as only integer times the reference frequency could be generated.

Hence it is an objective of the present invention to provide a phase locked oscillator with a wider choice available in the choice of output frequency than has previously been possible.

SHORT SUMMARY OF THE INVENTION

In order to achieve the objectives set forth above there is thus provided an analog phase locked oscillator comprising a sampling phase detector, a loop filter, a voltage controlled oscillator, a frequency multiplier, a feedback loop, where the feedback loop connects the output of said oscillator with the input of said phase detector through said frequency multiplier. The sampling phase detector is adapted to perform a discrete phase comparison between a reference frequency and the multiplied feedback signal, and the voltage controlled oscillator is adapted to give out a constant frequency at a multiply of the reference frequency divided with the multiplication factor of the multiplier.

In a preferred embodiment of the phase locked oscillator according to the invention the voltage controlled oscillator comprises an acoustic wave component, for example a surface acoustic wave component.

In a further preferred embodiment of the phase locked oscillator according to the invention the surface acoustic wave based oscillator is adapted for operation in the frequency range of 100 MHz-2.5 GHz.

In a still preferred embodiment of the phase locked oscillator according to the invention the signal frequency multiplier comprises a non-linear electric circuit module.

In a yet still preferred embodiment of the phase locked oscillator according to the invention the signal frequency multiplier device comprises a transistor based multiplier circuit.

In a further still preferred embodiment of the phase locked oscillator according to the invention the signal frequency multiplier device comprises a diode based multiplier circuit.

In a yet a preferred embodiment of the phase locked oscillator according to the invention the feedback loop is impedance matched to a generally 50 Ohm system at each end.

SHORT DESCRIPTION OF THE DRAWINGS

The phase locked oscillator based on a sampling phase detector (SPD) according to the invention will now be described in more detail with reference to the two accompanying drawings.

DETAILED DESCRIPTION OF THE INVENTION

Figure 1:
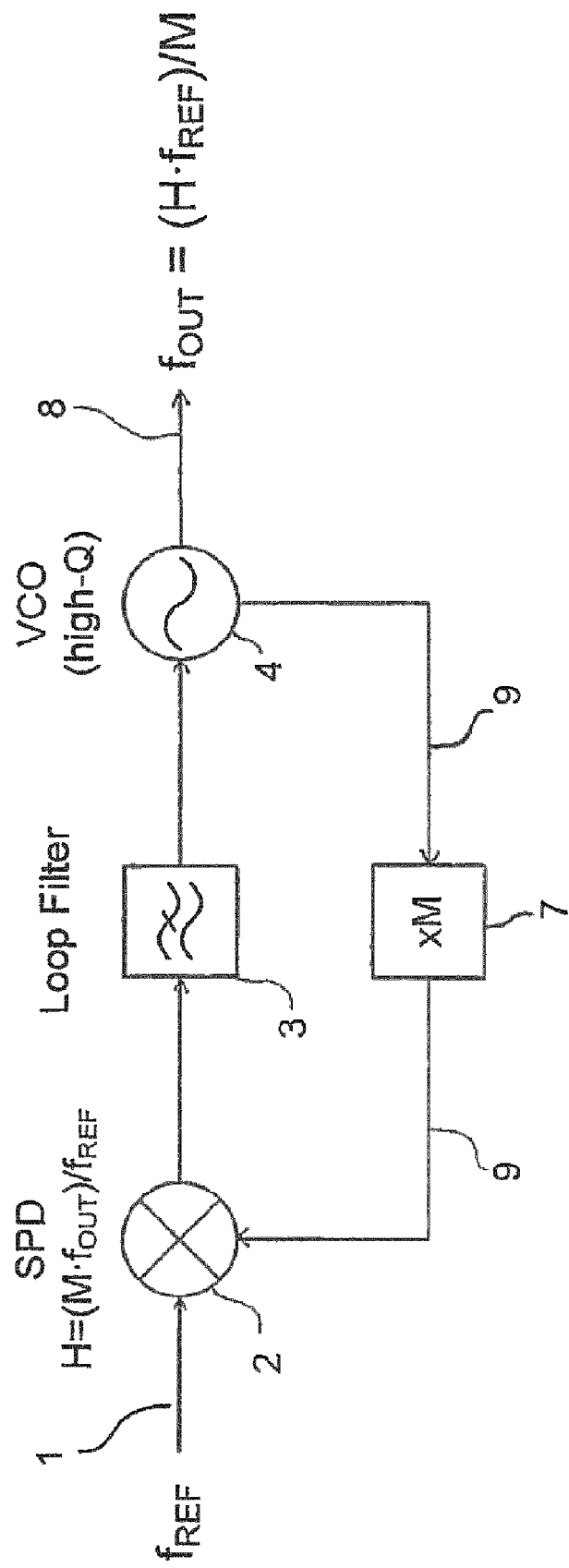
FIG. 1 is a schematic diagram illustrating the phase locked oscillator based on a sampling phase detector according to the invention.

Referring to FIG. 1 there is shown an example embodiment of a phase locked oscillator based on a sampling phase detector according to the invention. A reference frequency signal 1, denoted $f_{REF}$, is provided at a first input of a type of harmonic mixer known as a sampling phase detector (SPD) 2. The output of the sampling phase detector 2 is filtered in a low pass loop filter 3 in order to remove high frequency harmonics above a frequency given by the characteristics of the filter 3. After filtering the signal is applied to a voltage controlled oscillator (VCO) 4. Preferably the voltage controlled oscillator 4 is a device with high Q-factor (quality factor) in order to avoid the possibility of locking on several frequencies within the resonance of the VCO 4.

In an ordinary analogue phase locked oscillator a phase detector continuously compares the phase of the reference signal with the phase of the feedback signal. In a SPD based phased locked oscillator according to the present invention, an ordinary phase detector is replaced with a non-continuously phase detector that samples the phase of the feedback signal from the VCO 4. The period of the sample pulse is the same as the period of the reference signal 1, and the sample pulse is sampling directly on the RF-signal from the VCO 4. Thus the SPD compares the phase of the two signals which are different in frequency.

In the frequency range of 100 MHz-2.5 GHz a surface acoustic wave (SAW) device is particularly attractive as the resonating element in the voltage controlled oscillator 4 due to its small size and the high Q-factor. However, other types of voltage controlled oscillators 4 could also be used, for example oscillators based on dielectric resonators. Dielectric ceramic resonators are more attractive at higher frequencies, above the possible operating ranges of SAW-based VCO devices.

A first output of the SAW VCO 4 is applied to the multiplier 7 in the feedback loop 9 providing a second input signal to the sampling phase detector (SPD) 2, thereby closing the phase locked loop, while a second output of the SAW VCO 4 is the signal output 8 of the phase locked oscillator according to the invention. An attractive feature of this circuit is that the excess noise is very low, close to the theoretical minimum of the multiplied reference 1. Thus the phase noise performance is clearly a benefit compared to an ordinary phase locked oscillator.

A characteristic feature of the present invention is that a frequency multiplier 7 is inserted in the feedback loop 9 for multiplying the frequency of the signal from the SAW VCO 4 by a factor M. The frequency multiplier 7 can be a frequency doubling device, a tripling device or a higher order multiplication device. One example of a frequency doubler device is described in the publication "Switching Diode Frequency Doublers" by Charles Wenzel, at the web-address http://www.wenzel.com/pdffiles/diodedbl.pdf, printed on Mar. 26, 2006. A person skilled in the art will realize that such a frequency doubler can be realized in a number of similar, but slightly different ways, and still be useful in this invention. The multiplier 7 in the feedback loop 9 makes it possible to lock on to the sub harmonic of the reference frequency 1. With this feature the phase locked oscillator can be locked to a frequency grid where the frequency points have a distance smaller than the reference frequency 1. This enables the SPD based phase locked oscillator to have a wider range of use.

As opposed to a traditional sampling phase-locked oscillator (SPLO) where the VCO 4 is locked on the harmonic frequency of the reference frequency 1 which is closest to the free-running frequency of the VCO 4, in the circuit according to the present invention the SPLO will not lock to the frequency closest to the free-running frequency of the VCO 4, but rather to a multiple of the free running frequency of the VCO 4, the multiple frequency being defined by the frequency multiplier 7 of the feedback loop 9.

In this way a main limitation of the prior art known to these inventors is overcome in that the introduction of a multiply-by-M in the loop enables a finer resolution of the selected output frequency 8. Multiplication by 2, 3, 4 or higher can be achieved, for example by arranging several frequency doublers or triplers in cascade.

If for example, the H$^{th}$ harmonic is selected as comparing frequency in the sampling phase detector 2, the SAW VCO resonator frequency can be selected at the half of this frequency, by setting the multiplier M equal to 2 in the feedback loop 9. It should be noted that the choice of the H$^{th}$ harmonic is somewhat arbitrary, any available comparing frequency in the SPD 2 could in principle be used. As an example H could be chosen to be 233. The signal frequency at the output 8 of the device, f$_{out}$, is thus given by the following equation:

$$f_{out}=(H \cdot f_{REF}/M) \qquad (1)$$

where H is the order of harmonic of the selected comparing frequency, f$_{REF}$ is the reference frequency 1 and M is the multiplication factor in the feedback multiplier 7.

As a result of this method, a resolution of f$_{REF}$/2 can be obtained.

Basically, any non-linear circuit device could be used to obtain the signal multiplication effect in the signal multiplications device 7. However, one preferred device is a transistor based multiplier circuit, otherwise known to a person skilled in the art. As an alternative, a diode based multiplier circuit could also be used.

Figure 2:
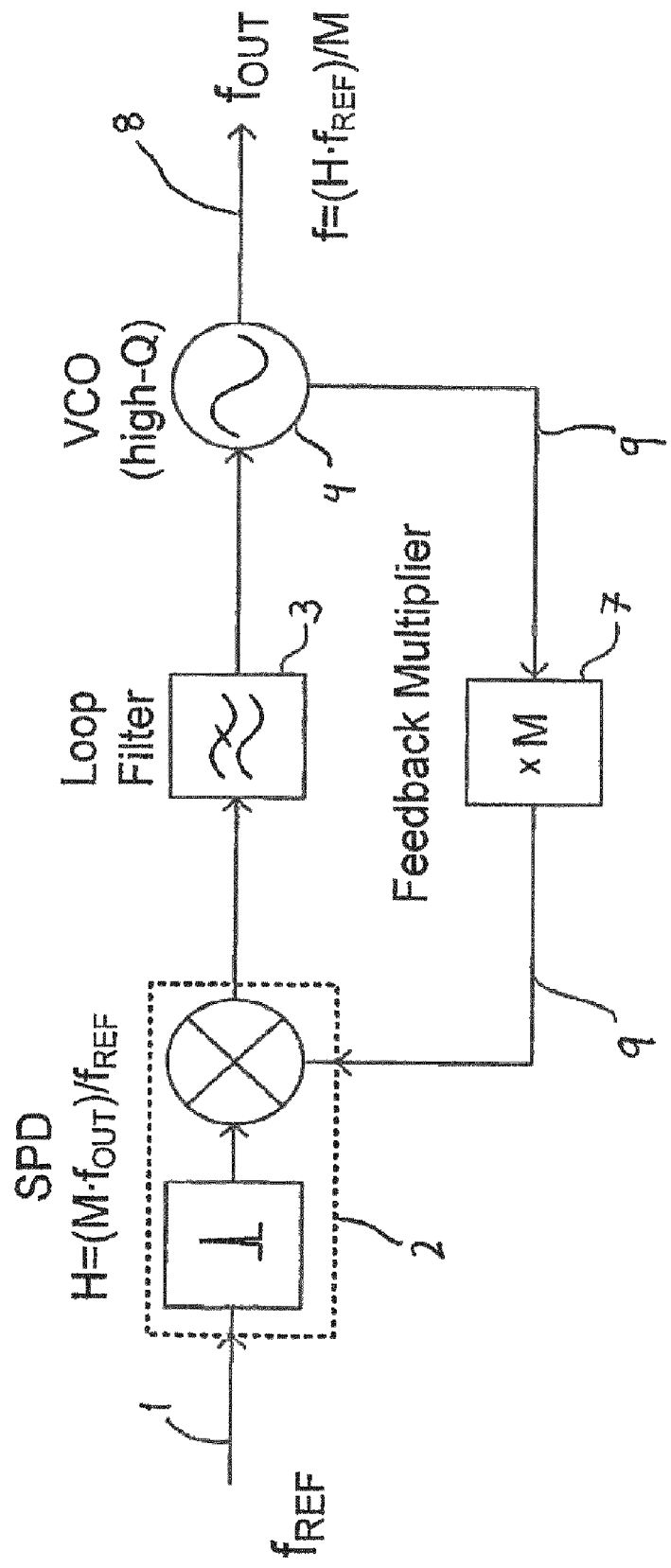
FIG. 2 is an extended schematic diagram illustrating the phase locked oscillator based on a sampling phase detector with a discrete phase comparison function according to the invention.

FIG. 2 is an extended schematic illustration of the phase locked oscillator based on a sampling phase detector (SPD) 2. The SPD 2 according to the present invention performs a discrete phase comparison, and this is clarified by introducing the generation of the sample pulse in the illustration of the SPD 2 component in this figure. The selected harmonic of the reference signal 1 generated in the SPD 2 is given by the following equation:

$$H=(M \cdot f_{out})/f_{REF} \qquad (2)$$

where M is the multiplication factor of the feedback multiplier 7, f$_{out}$ is the output frequency 8 and f$_{REF}$ is the reference frequency 1.

The oscillator circuit of the present invention can either be realized as a combined hybrid/discrete circuit, or it can be a fully hybridized circuit. Typically, at least the SPD 2 will be a hybrid device. Further, the VCO 4 could be a hybrid component. The SAW component is normally mounted in a separate hermetic package. The circuit is typically in addition provided with a regulated power supply (not illustrated) for providing power to all the components. A power supply device could also be realized as a hybrid component.

The actual circuit is typically a design based on discrete components, however, it can be envisaged that parts of the circuit could be designed as a combined discrete/hybrid circuit or a fully hybridized circuit.

In conclusion, the present invention provides an phase locked oscillator device where an input of a relatively low frequency, perhaps at about 10 MHz, can be used to provide a wider choice of output frequencies 8 at frequencies larger than the input frequency, with a higher resolution than the input reference frequency 1. This wider choice of output frequencies 8 is a result of using a multiplier 7 in the architecture of a phase locked oscillator based on a SPD 2. An input reference of 10 MHz is often a readily available clocking signal in many applications, and it will not be required to provide a separate clock, if the 10 MHZ clock signal can be utilized. In some embodiments a separate clock may be necessary to provide the desired input reference signal frequency 1, however, an additional clock unit adds to the cost of the circuit.

A typical application of the oscillator circuit of the present invention is in frequency up-converter devices and frequency down-converter devices for shifting communication or radar signals from frequency bands that are suitable for electronic processing and for shifting signals to/from frequency bands to be used during transmission between different communication system units.

The invention claimed is:
1. An analog phase locked oscillator comprising
a sampling phase detector,
a loop filter, a voltage controlled oscillator,
a frequency multiplier,
a feedback loop
wherein the feedback loop of said analog phase locked oscillator connects the output of said oscillator with the input of said phase detector through the frequency multiplier, the sampling phase detector is adapted to perform a discrete phase comparison between a reference frequency and the multiplied feedback signal at a frequency different from the reference frequency, the voltage controlled oscillator is adapted to give out a constant frequency at a multiply of the reference frequency divided with the multiplication factor of the multiplier.

2. Oscillator according to claim 1, wherein the voltage controlled oscillator comprises an acoustic wave component, for example a surface acoustic wave device.

3. Oscillator according to claim 2, wherein the surface acoustic wave based oscillator is adapted for operation in the frequency range of 100 MHz-2.5 GHz.

4. Oscillator according to claim 1, wherein the signal frequency multiplier comprises a non-linear electric circuit module.

5. Oscillator according to claim 4, wherein said signal frequency multiplier comprises a transistor based multiplier circuit.

6. Oscillator according to claim 4, wherein the signal frequency multiplier comprises a diode based multiplier circuit.

7. Oscillator according to claim 1, wherein the feedback loop is impedance matched to a generally 50 Ohm system at each end.

* * * * *